United States Patent
Saruki et al.

(10) Patent No.: US 7,236,392 B2
(45) Date of Patent: *Jun. 26, 2007

(54) METHOD AND APPARATUS FOR TESTING TUNNEL MAGNETORESISTIVE EFFECT ELEMENT

(75) Inventors: Shunji Saruki, Tokyo (JP); Kenji Inage, Tokyo (JP); Nozomu Hachisuka, Tokyo (JP); Hiroshi Kiyono, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/101,468

(22) Filed: Apr. 8, 2005

(65) Prior Publication Data

US 2005/0237789 A1    Oct. 27, 2005

(30) Foreign Application Priority Data

Apr. 23, 2004   (JP)   ............................. 2004-128111

(51) Int. Cl.
*G11B 5/455*   (2006.01)
(52) U.S. Cl. ..................... 365/158; 365/201; 360/324.2
(58) Field of Classification Search ................ 365/158, 365/185.28, 201, 171, 173; 360/324.2
See application file for complete search history.

(56) References Cited

U.S. PATENT DOCUMENTS 6,359,433 B1 *  3/2002  Gillis et al. ................. 324/210
6,473,257 B1 * 10/2002  Shimazawa et al. .......... 360/66
6,657,829 B2 * 12/2003  Nakazawa et al. ....... 360/324.2
6,820,020 B2 * 11/2004  Yokoyama et al. ........... 702/65

FOREIGN PATENT DOCUMENTS

JP           2000-260012          9/2000

OTHER PUBLICATIONS

Bae et al. Dec. 15, 2003. Electrical Reliability of Tunnelling Magnetoresistive Heads. Journal of Applied Physics. vol. 94 No. 12.*
U.S. Appl. No. 11/070,237, by Shunji et al., filed Mar. 3, 2005.

* cited by examiner

*Primary Examiner*—Richard T. Elms
*Assistant Examiner*—Douglas King
(74) *Attorney, Agent, or Firm*—Buchanan Ingersoll & Rooney, PC

(57) ABSTRACT

Testing a TMR element includes a step of measuring initially a resistance value of the TMR element to provide the measured resistance value as a first resistance value, a step of measuring a resistance value of the TMR element after continuously feeding a current through the TMR element from a anti-substrate side to a substrate side for a predetermined period of time, to provide the measured resistance value as a second resistance value, and a step of evaluating the TMR element by comparing the first resistance value and the second resistance value with each other.

10 Claims, 6 Drawing Sheets

US 7,236,392 B2

METHOD AND APPARATUS FOR TESTING TUNNEL MAGNETORESISTIVE EFFECT ELEMENT

PRIORITY CLAIM

This application claims priority from Japanese patent application No. 2004-128111, filed on Apr. 23, 2004, which is incorporated herein by reference.

BACKGROUND OF THE INVENTION

1. Field of the Invention

The present invention relates to a method and apparatus for testing a tunnel magnetoresistive effect (TMR) element such as a TMR head element using the tunnel magnetoresistive effect or a magnetoresistive random access memory (MRAM).

2. Description of the Related Art

An evaluation test is in general performed for determining whether or not a thin-film magnetic head with a magnetoresistive effect (MR) head element is a non-defective product, during or after manufacturing the magnetic head. This evaluation test includes a stability test for confirming that any random telegraph noise (RTN) such as Barkhausen noise (BHN) is not produced from the MR head element, and a reliability test for confirming that a breakdown voltage of the MR head element is sufficiently high to withstand an extended period of use.

Actually, for all the MR head elements manufactured, performed is the stability test by using for example a dynamic performance (DP) tester to confirm that no reproduced output of the head elements exceeds a threshold level due to the RTN for a predetermined period of time. However, because the RTN is a burst noise, it may not be generated during the predetermined period of time. Even if the RTN is generated, it may not be detected due to its level lower than the threshold.

Japanese patent publication No. 2000-260012 discloses a testing method of a stability of a normal MR head element but not a TMR head element. In this method, change in the reproduced output from the MR head element is evaluated by repeatedly executing a step of applying both AC record current and external DC magnetic field to the MR head element and a step of measuring the reproduced characteristics after that application.

However, this testing method not only additionally needs a magnetic field generation device for applying the external DC magnetic field to the MR head element but also adversely affects a bias magnetic field of the MR head element due to the application of the external magnetic field. On top of that, it is difficult to detect the burst noise RTN with reliability even by this testing method.

As will be noted, the conventional reliability test of measuring a breakdown voltage of the magnetic head cannot be performed for all the magnetic heads because it breaks the magnetic head during the breakdown voltage measurement.

In order to solve such problems, the applicants of this application have proposed a testing method and apparatus for evaluating whether a TMR element is non-defective product or not by feeding a current through the TMR element from the substrate side or lower side to the anti-substrate side or upper side, and by comparing a rate of change from its initial resistance to its resistance after continuously feeding the current with a threshold (Japanese patent application No. 2004-062031, filed on Mar. 5, 2004, U.S. patent Ser. No. 11/070,237 by Shunji et al., filed on Mar. 3, 2005).

However, according to this testing method and apparatus, because it is necessary to determine the threshold value of the resistance-changing ratio each time the period for feeding the current, the voltage applied to the TMR element and the material for the TMR element change, the testing procedure becomes very complicated. Therefore, it is very difficult to evaluate whether each TMR element is a non-defective product or not.

BRIEF SUMMARY OF THE INVENTION

It is therefore an object of the present invention to provide a method and apparatus for testing a TMR element, whereby stability and reliability of the TMR element can be extremely easily confirmed without destroying the element.

According to the present invention, a method for testing a TMR element includes a step of measuring initially a resistance value of the TMR element to provide the measured resistance value as a first resistance value, a step of measuring a resistance value of the TMR element after continuously feeding a current through the TMR element from a anti-substrate side (upper side) to a substrate side (lower side) for a predetermined period of time, to provide the measured resistance value as a second resistance value, and a step of evaluating the TMR element by comparing the first resistance value and the second resistance value with each other.

With respect to a plurality of TMR elements, if a current is fed from a anti-substrate side (upper side) to a substrate side (lower side), a distribution of degrees of change in their resistances determined based upon the first resistance value (initial resistance value) and the second resistance value (resistance value just after continuously feeding the current through the TMR element from the anti-substrate side to the substrate side for a predetermined time period), that is a distribution of rates of change in resistance values or changed amount of resistance values, polarizes two groups. The first group is a set of the TMR elements with rates of change in resistance values or changed amount of resistance values smaller than 1, whereas the second group is a set of the TMR elements with rates of change in resistance values or changed amount of resistance values equal to or larger than 1. Many of the TMR elements in the second group generate RTN, whereas few of the TMR elements in the first group generate RTN. Also, breakdown voltages of the TMR elements in the first group are higher than those of the TMR elements in the second group. Therefore, it is possible to extremely easily evaluate non-defective/defective with respect to a TMR element by confirming stability and reliability of the TMR element depending upon whether the second resistance that is the resistance value just after continuously feeding a current through the TMR element for a predetermined time period is smaller than the first or initial resistance value. Moreover, because this evaluation test can be performed without destroying the TMR element, 100% inspection of the manufactured TMR elements becomes possible. Particularly, according to the present invention, because evaluation test of non-defective and defective products can be performed only by judging whether the resistance after the passage of current is smaller than the initial resistance or not irrespective of the period for feeding the current to the TMR head element, the voltage applied to the TMR head element and the material for the TMR head element, the evaluation test procedure can become extremely simple.

It is preferred that the step of evaluating includes evaluating the TMR element depending upon whether the second resistance value $R_2$ is smaller than the first resistance value $R_1$ or not.

It is also preferred that the evaluating step includes judging that the TMR element is non-effective product when the second resistance value $R_2$ is smaller than the first resistance value $R_1$.

It is preferred that the predetermined period of time is a predetermined time period of two to three minutes.

It is also preferred that the TMR element is a TMR head element or a MRAM.

According to the present invention, also, an apparatus for testing a TMR element includes a unit for measuring initially a resistance value of the TMR element to provide the measured resistance value as a first resistance value, a unit for measuring a resistance value of the TMR element after continuously feeding a current through the TMR element from a anti-substrate side (upper side) to a substrate side (lower side) for a predetermined period of time, to provide the measured resistance value as a second resistance value, and a unit for evaluating the TMR element by comparing the first resistance value and the second resistance value with each other.

As aforementioned, with respect to a plurality of TMR elements, if a current is fed from a anti-substrate side (upper side) to a substrate side (lower side), a distribution of degrees of change in their resistances determined based upon the first resistance value (initial resistance value) and the second resistance value (resistance value just after continuously feeding the current through the TMR element from the anti-substrate side to the substrate side for a predetermined time period), that is a distribution of rates of change in resistance values or changed amount of resistance values, polarizes two groups. The first group is a set of the TMR elements with rates of change in resistance values or changed amount of resistance values smaller than 1, whereas the second group is a set of the TMR elements with rates of change in resistance values or changed amount of resistance values equal to or larger than 1. Many of the TMR elements in the second group generate RTN, whereas few of the TMR elements in the first group generate RTN. Also, breakdown voltages of the TMR elements in the first group are higher than those of the TMR elements in the second group. Therefore, it is possible to extremely easily evaluate non-defective/defective with respect to a TMR element by confirming stability and reliability of the TMR element depending upon whether the second resistance that is the resistance value just after continuously feeding a current through the TMR element for a predetermined time period is smaller than the first or initial resistance value. Moreover, because this evaluation test can be performed without destroying the TMR element, 100% inspection of the manufactured TMR elements becomes possible. Particularly, according to the present invention, because evaluation test of non-defective and defective products can be performed only by judging whether the resistance after the passage of current is smaller than the initial resistance or not irrespective of the period for feeding the current to the TMR head element, the voltage applied to the TMR head element and the material for the TMR head element, the evaluation test procedure can become extremely simple.

It is preferred that the evaluating unit includes a evaluation unit for evaluating the TMR element depending upon whether the second resistance value $R_2$ is smaller than the first resistance value $R_1$ or not.

It is also preferred that the evaluation unit includes a unit for judging that the TMR element is non-effective product when the second resistance value $R_2$ is smaller than the first resistance value $R_1$.

It is preferred that the predetermined period of time is a predetermined time period of two to three minutes.

It is also preferred that the TMR element is a TMR head element or a MRAM.

Further objects and advantages of the present invention will be apparent from the following description of the preferred embodiments of the invention as illustrated in the accompanying drawings.

DETAILED DESCRIPTION OF THE INVENTION

Figure 1:
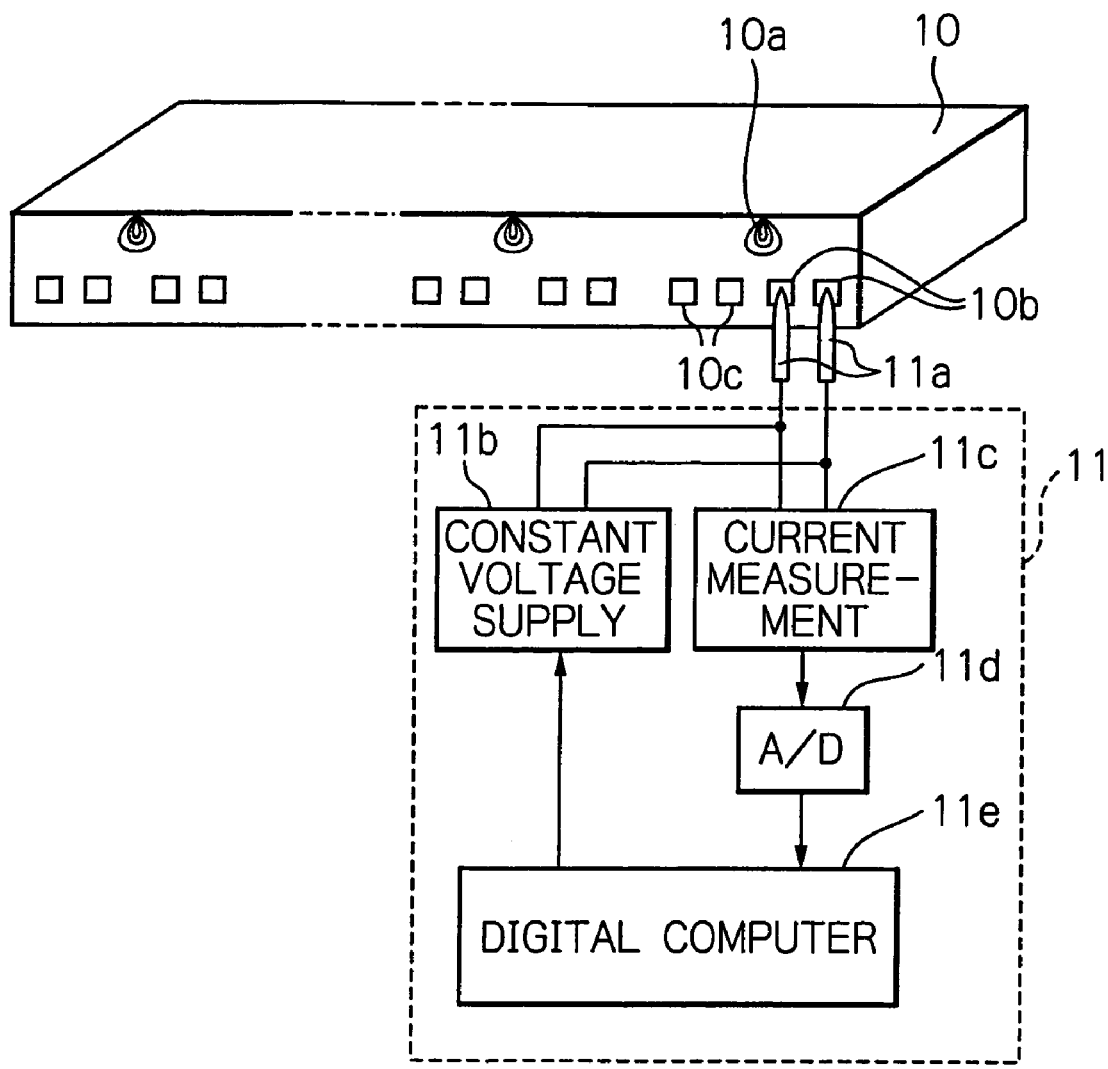
FIG. 1 is a view schematically illustrating a configuration of testing a TMR head element as a preferred embodiment according to the present invention.

FIG. 1 schematically illustrates a configuration of testing a TMR head element as a preferred embodiment according to the present invention.

In the figure, reference numeral 10 denotes a bar member or bar block with a plurality of aligned TMR heads that are not individually separated yet, and 11 denotes a testing apparatus of the TMR head element.

The bar member 10 is provided by forming a large number of TMR heads arranged in matrix on a wafer according to thin-film technology, by cutting the wafer into bar shaped members so that each member has the aligned magnetic heads, and by lapping the ABS of the head member 10 so as to adjust gap-depth (MR height) of the heads. Each TMR head 10a of the bar member 10 is provided with a TMR read head element, an inductive write head element, a pair of terminal pads 10b electrically connected to the TMR read head element, and a pair of terminal pads 10*c* electrically connected to the inductive write head element.

The testing apparatus 11 has a pair of probes 11*a* that can be electrically contact to the pair of terminal pads 10*b* of the TMR head element, a constant voltage supply circuit 11*b* electrically connected to the pair of probe 11*a*, for supplying a constant voltage to the TMR head element, a current measurement circuit 11*c* electrically connected to the pair of probe 11*a*, for measuring current flowing through the TMR head element, a analog to digital (A/D) converter 11*d* electrically connected to the current measurement circuit 11*c*, for converting its analog output into digital signals, and a digital computer 11*e* electrically connected to the A/D converter 11*d* and the constant voltage supply circuit 11*b*. The digital computer 11*e* sequentially receives the digital signals from the A/D converter 11*d* and calculates an initial resistance $R_1$ and a resistance after the passage of current $R_2$ so as to judge whether or not the TMR head element is defective. Also, the digital computer 11*e* controls the operations of the constant voltage supply circuit 11*b* and the A/D converter 11*d*.

Figure 2:
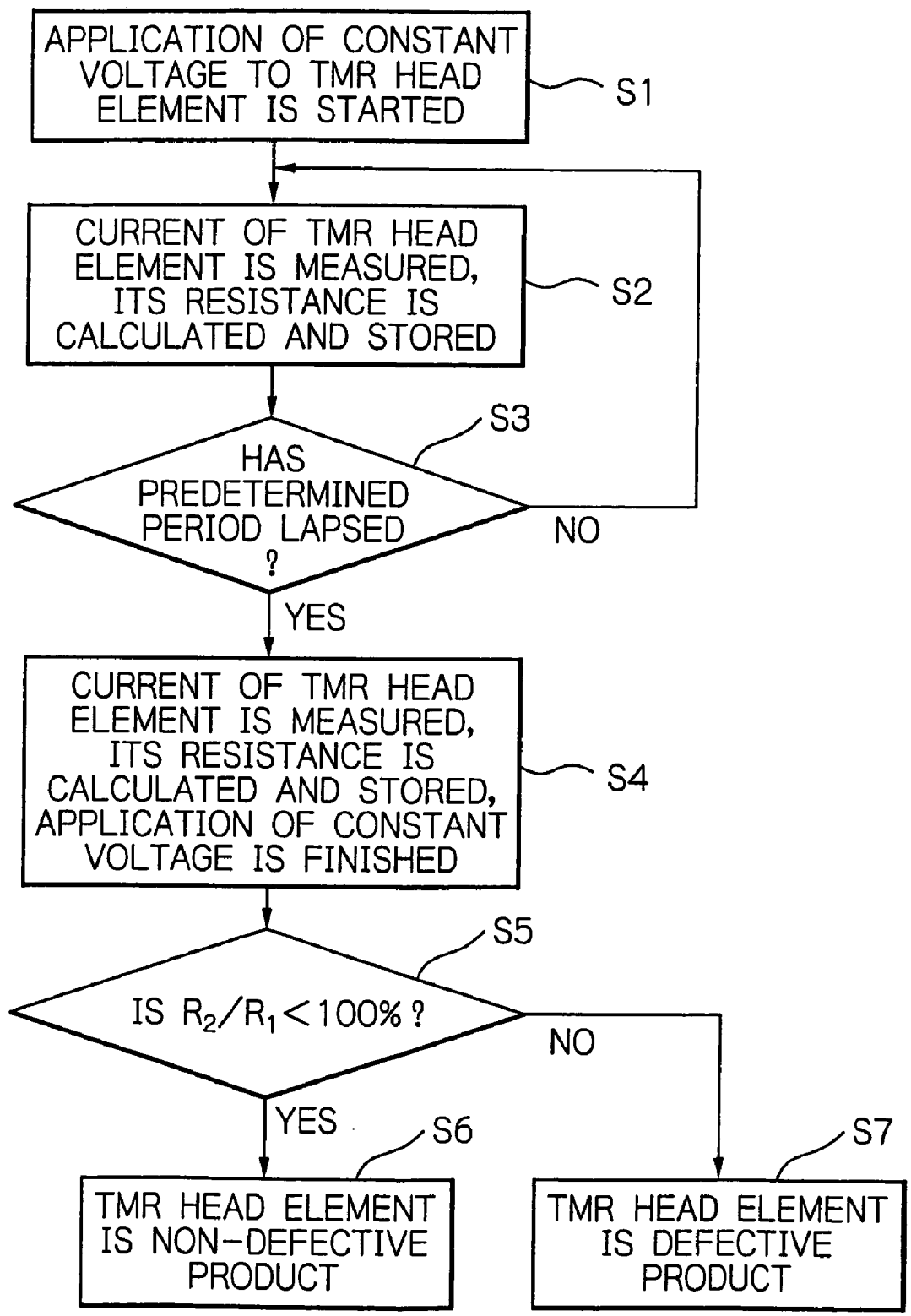
FIG. 2 is a flow chart illustrating a testing procedure in the embodiment of FIG. 1.

FIG. 2 illustrates a testing procedure of the testing apparatus 11 in this embodiment.

As shown in the figure, first, the pair of probes 11*a* are brought into electrical contact with the terminal pads 10*b* of the TMR head element to be tested in the bar member 10, and under this state application of a constant voltage of 150 mV for example to the TMR head element from the constant voltage supply circuit 11*b* is started (Step S1). In this case, the voltage should be applied so that the current certainly flows downward in the laminating direction (from the anti-substrate side or upper side to the substrate side or lower side in the laminating direction) of the TMR head element irrespective of the laminated order of TMR multi-layers.

Then, a value of the current flowing through the TMR head element is measured and the measured current value is input into the computer 11*e* to calculate a resistance value of the TMR head element (Step S2). The resistance value can be easily calculated from the applied constant voltage, for example 150 mV, and from the measured current value. The calculated resistance value is stored in the computer 11*e*. Particularly, initially obtained resistance value is stored as a resistance $R_1$.

Then, it is judged whether or not a predetermined period of time such as for example 2–3 minutes (2 minutes and 15 seconds in this embodiment) has lapsed from the start of the application of the constant voltage (Step S3). If not, namely the predetermined period has not lapsed yet, the measurement and calculation process at Step S2 is repeatedly executed. If it is yes, namely the predetermined period has lapsed, a process of next Step S4 is executed.

At Step S4, a resistance value is calculated based upon the last measured current value, the calculated resistance is stored in the computer 11*e* as a resistance $R_2$, and then the application of the constant voltage is finished.

As a result, the resistance value just after the constant voltage application is started is stored as the resistance $R_1$, and the resistance value just before the constant voltage application is terminated is stored as the resistance $R_2$. The resistance $R_1$ corresponds to an initial resistance value of the TMR head element before a current flows, and the resistance $R_2$ corresponds to a resistance value of the TMR head element after a current continuously flows through the TMR head element for a predetermined period of time.

Thereafter, whether or not a rate of change in resistance $(R_2/R_1) \times 100$ (%) is smaller than 100 (%), namely whether or not the resistance value after the passage of current $R_2$ is smaller than the initial resistance value $R_1$ is judged (Step S5).

If yes, namely the rate of change in resistance is smaller than 100 (%), it is evaluated that the TMR head element is non-defective product (Step S6). If no, namely the rate of change in resistance is not smaller than 100 (%), that is equal to or larger than 100 (%), it is evaluated that the TMR head element is defective product (Step S7).

Then, the remaining TMR head elements in the bar member 10 are sequentially evaluated in the same manner.

Figure 3:
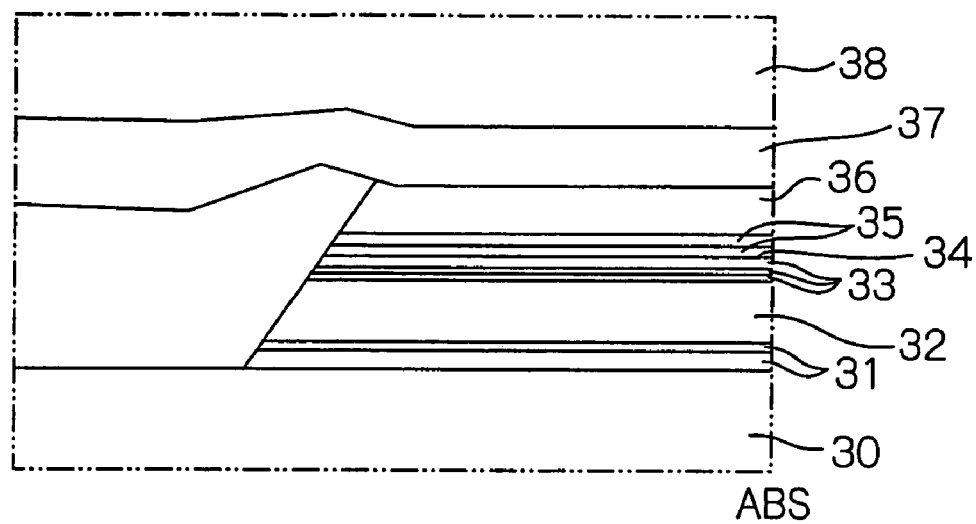
FIG. 3 is a sectional view, seen along a direction orthogonal to an air bearing surface (ABS) of the head element, illustrating an example structure of each TMR head element in the embodiment of FIG. 1.
Figure 4:
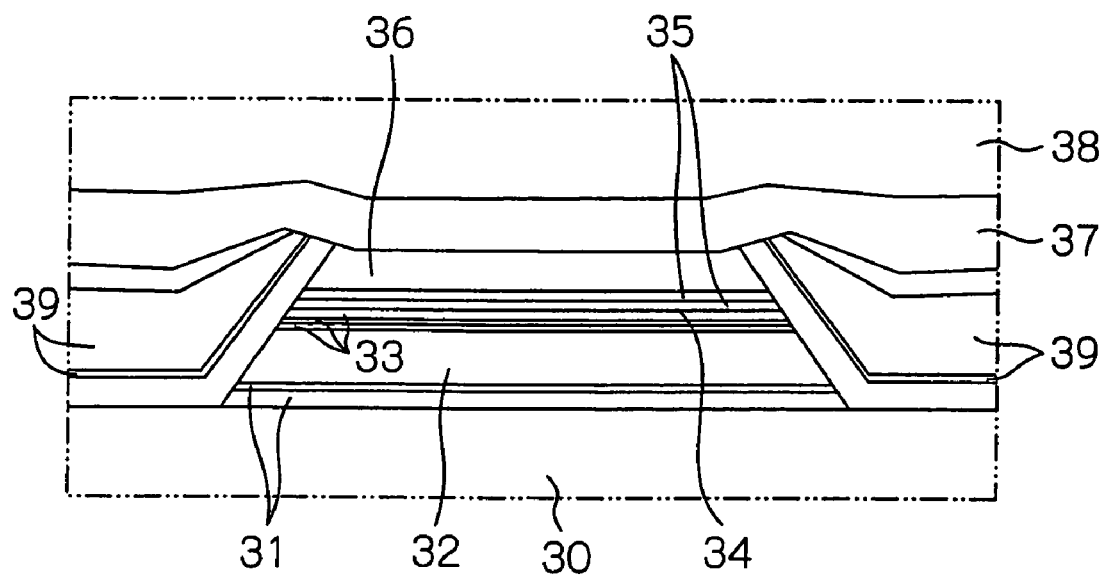
FIG. 4 is a sectional view, seen from the ABS, illustrating the TMR head element of FIG. 3.

FIGS. 3 and 4 illustrate an example structure of each TMR head element in this embodiment. FIG. 3 shows a section seen along a direction orthogonal to the ABS of the TMR head element and FIG. 4 shows is a section seen from the ABS.

As shown in these figures, a TMR film of the TMR head element has a multilayered structure of an anti-ferromagnetic layer (PtMn 15 nm) 32, a pin layer (CoFe 2 nm/Ru 0.8 nm/CoFe 3 nm) 33, a barrier layer (Al 0.575 nm-Ox) 34, a free layer (CoFe 2 nm/NiFe 3 nm) and a cap layer (Ta) 36 sequentially laminated on a lower shield layer (NiFe) 30 through a buffer layer (Ta/NiFe) 31. On the TMR film, a metal gap layer 37 and an upper shield layer 38 are laminated. Bias layers 39 are formed in lateral regions located in the track-width direction of the TMR film. In modifications, the order of lamination of the TMR multi-layers may be in inverse.

Hereinafter, why the procedure shown in FIG. 2 is possible to evaluate non-defective/defective with respect to the TMR head element will be described.

Figure 5:
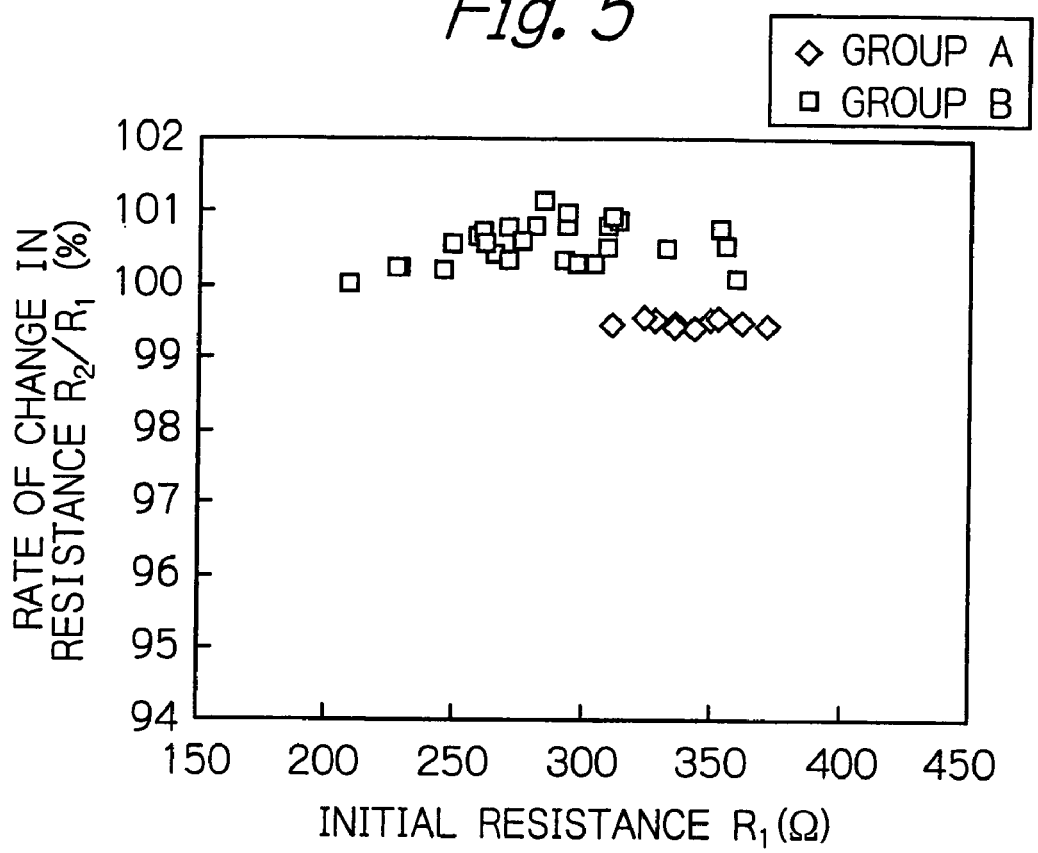
FIG. 5 is a graph illustrating the measured result of initial resistances $R_1$ and resistances after the passage of current $R_2$ with respect to many TMR head elements.
Figure 6:
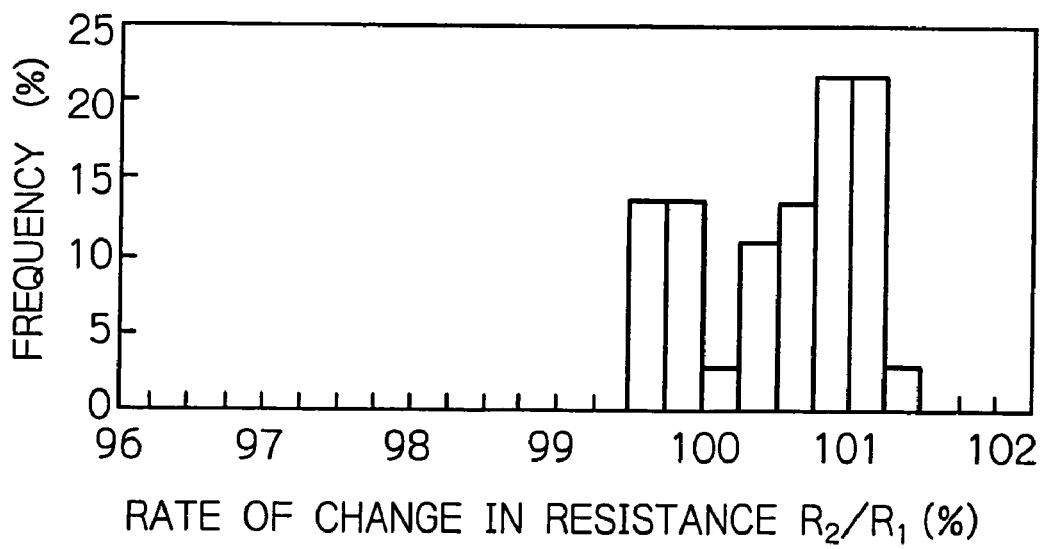
FIG. 6 is a graph illustrating the measured result of initial resistances $R_1$ and resistances after the passage of current $R_2$ with respect to many TMR head elements.

FIGS. 5 and 6 illustrate the measured result of initial resistances $R_1$ and resistances after the passage of current $R_2$ with respect to many TMR head elements. The lateral axis of FIG. 5 indicates an initial resistance $R_1$ ($\Omega$) and the longitudinal axis thereof indicates a rate of change in resistance $R_2/R_1$ (%) that is (resistance after the passage of current)/(initial resistance). The lateral axis of FIG. 6 indicates a rate of change in resistance $R_2/R_1$ (%) and the longitudinal axis thereof indicates its frequency (%).

As shown in these figures, the distribution of the rate of change in resistance $R_2/R_1$ that is the changed ratio of resistance after the passage of current with respect to the initial resistance of the TMR head element polarized into groups A and B. Also, from these figures, it was revealed that the threshold between the groups A and B is 100 (%) of the rate of change in resistance $R_2/R_1$.

Then, stability and reliability of the TMR head elements in each group were confirmed.

Figure 7:
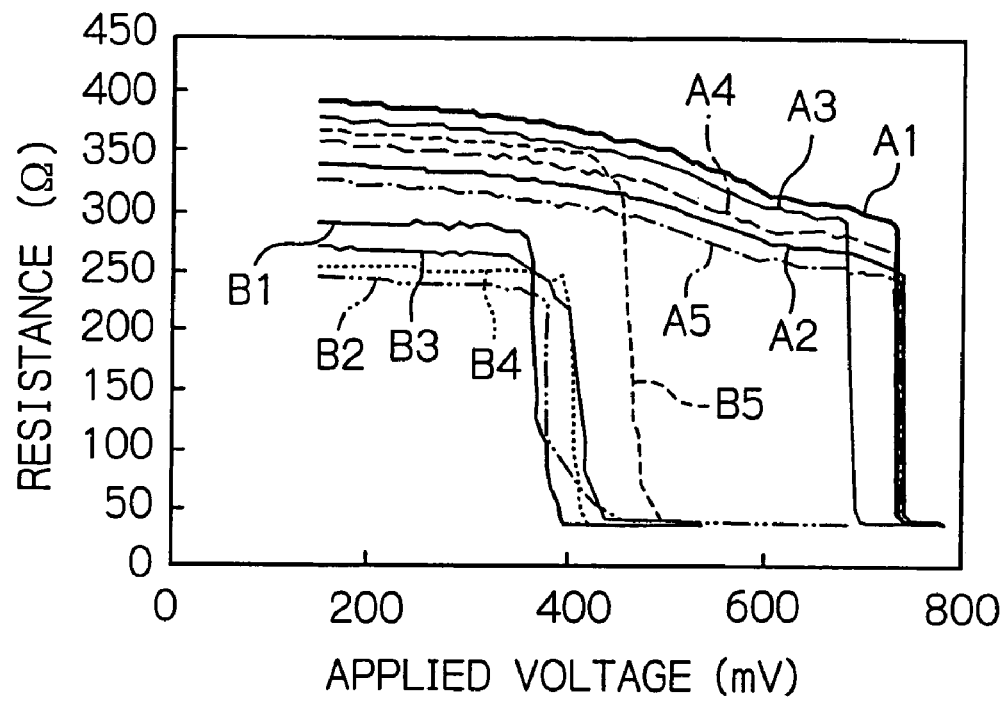
FIG. 7 is a graph illustrating the measured result of breakdown voltages by increasing applied voltages to the TMR head elements contained in groups A and B.
Figure 8:
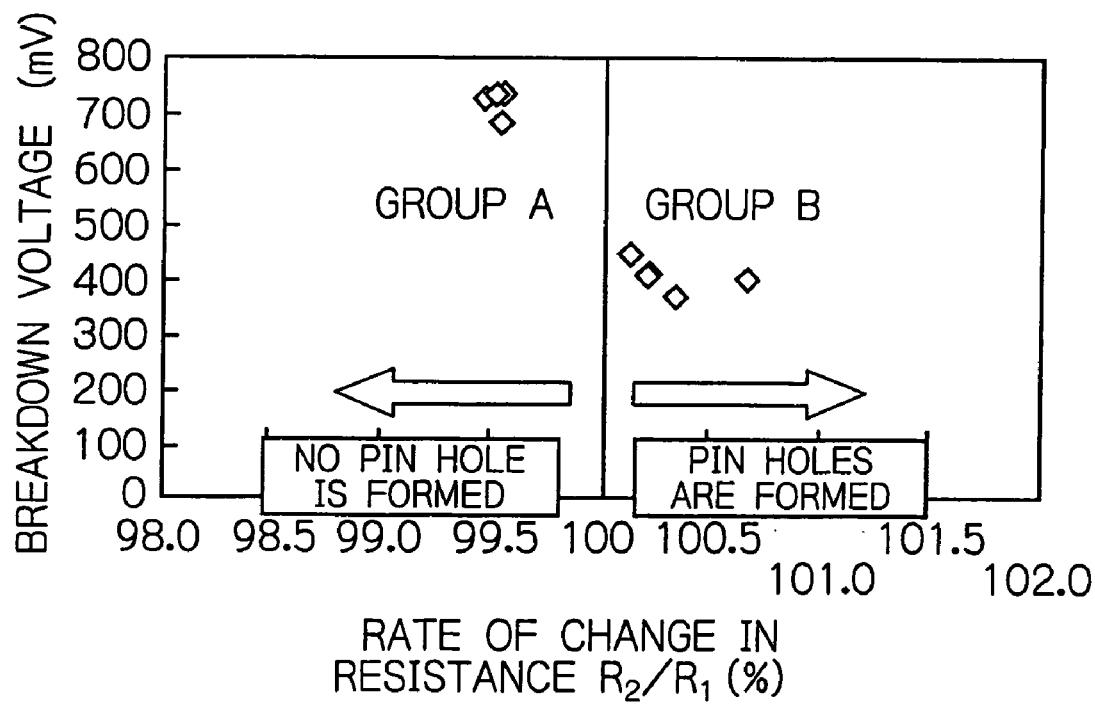
FIG. 8 is a graph illustrating the measured result of breakdown voltages by increasing applied voltages to the TMR head elements contained in groups A and B.

Namely, breakdown voltages were checked for the TMR head elements $A_1$–$A_5$ contained in the group A and the TMR head elements $B_1$–$B_5$ contained in the group B by gradually increasing the applied voltages and measuring their resistances. The checked result is shown in FIGS. 7 and 8. In FIG. 7, the lateral axis indicates an applied voltage (mV) and the longitudinal axis indicates a resistance ($\Omega$). In FIG. 8, the lateral axis indicates a rate of change in resistance $R_2/R_1$ (%) and the longitudinal axis indicates a breakdown voltage (mV).

As will be noted from FIG. 7, all the TMR head elements $A_1$–$A_5$ contained in the group A had breakdown voltages of about 700 mV that is higher than breakdown voltage of about 400 mV of the TMR head elements $B_1$–$B_5$ contained in the group B, and thus had extremely higher degree of reliability.

Also as clearly illustrated in FIG. 8, the breakdown voltages are polarized into two groups depending upon whether the resistance after the passage of current $R_2$ is smaller than the initial resistance $R_1$ or not, in other words, the rate of change in resistance $R_2/R_1$ is smaller than 100 (%) or not. The TMR head elements having rates of change in resistance $R_2/R_1$, is smaller than 100 (%) are highly stable and reliable, and thus are non-defective products. Contrary to this, the TMR head elements having rates of change in resistance $R_2/R_1$ is equal to or larger than 100 (%) are unstable and unreliable because pin holes may be formed in their barrier layers, and thus are defective products.

As will be understood, according to this embodiment, confirmation of stability and reliability of the TMR head element and therefore evaluation test of non-defective and defective products can be extremely easily performed. Also, according to this embodiment, because this evaluation test can be performed without destroying the TMR head element, 100% inspection of the manufactured TMR head elements becomes possible. Particularly, evaluation test of non-defective and defective products can be performed only by judging whether the resistance after the passage of current $R_2$ is smaller than the initial resistance $R_1$ or not, in other words, whether the rate of change in resistance $R_2/R_1$ is smaller than 100 (%) or not, irrespective of the period for feeding the current to the TMR head element, the voltage applied to the TMR head element and the material for the TMR head element. Therefore, the evaluation test procedure can become extremely simple.

In the aforementioned embodiment, in order to know an initial resistance and a resistance after the passage of current, a constant voltage is applied to the TMR head element and a current flowing through the TMR head element is measured. However, according to the present invention, the same can be obtained by feeding a constant current through the TMR head element and by measuring a voltage across the TMR head element.

Figure 9:
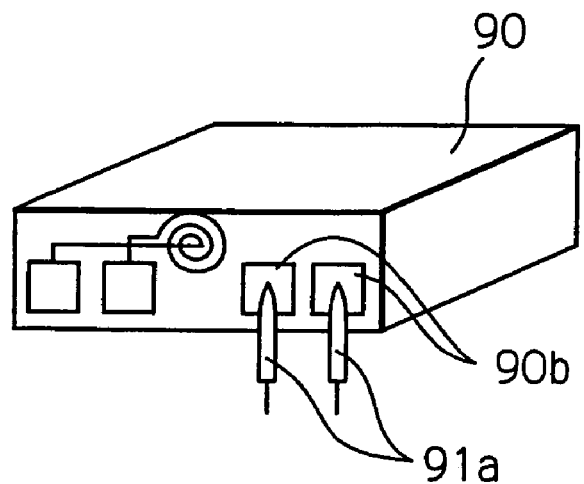
FIG. 9 is a view schematically illustrating a partial configuration of testing a TMR head element as another embodiment according to the present invention.

FIG. 9 schematically illustrates a partial configuration of testing a TMR head element as another embodiment according to the present invention.

In the embodiment of FIG. 1, the test of the TMR head element is conducted for the MR-height adjusted bar member with the aligned TMR heads not individually separated. However, in this embodiment, the test is performed for an individual magnetic head slider 90 separated from a bar member by electrically contacting a pair of probes 91a to a pair of terminal pads 90b of the TMR head element. Another configuration of the testing apparatus, operations and advantages of this embodiment are substantially the same as those of the embodiment of FIG. 1.

Figure 10:
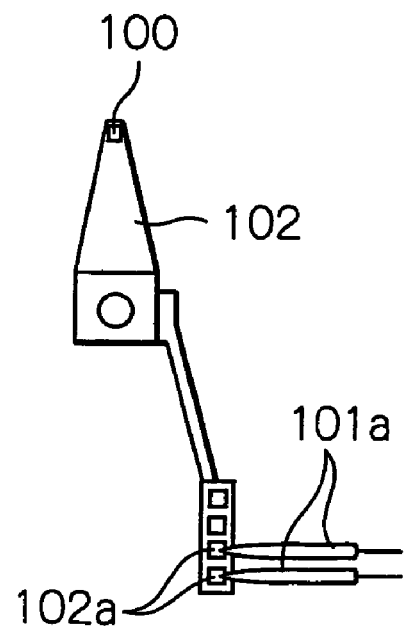
FIG. 10 is a view schematically illustrating a partial configuration of testing a TMR head element as further embodiment according to the present invention.

FIG. 10 schematically illustrates a partial configuration of testing a TMR head element as further embodiment according to the present invention.

In this embodiment, the test is performed for a head gimbal assembly (HGA) consisting of a suspension 102 and a magnetic head slider 100 mounted on the suspension 102 by electrically contacting a pair of probes 101a to a pair of connection pads 102a that are electrically connected to a TMR head element. Another configuration of the testing apparatus, operations and advantages of this embodiment are substantially the same as those of the embodiment of FIG. 1.

Although the aforementioned embodiments concern the method and apparatus for testing the TMR head element, it is apparent that the present invention can be similarly applied to a test of an MRAM.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A method for testing a tunnel magnetoresistive effect element comprising the steps of:
    measuring initially a resistance value of said tunnel magnetoresistive effect element to provide the measured resistance value as a first resistance value;
    measuring a resistance value of said tunnel magnetoresistive effect element after continuously feeding a current through said tunnel magnetoresistive effect element from an anti-substrate side to a substrate side for a predetermined period of time, to provide the measured resistance value as a second resistance value; and
    evaluating whether said tunnel magnetoresistive effect element is a non-defective product with no pinhole based upon a ratio of said second resistance value to said first resistance value.

2. The method as claimed in claim 1, wherein said evaluating step comprises judging that said tunnel magnetoresistive effect element is a non-defective product when said ratio is smaller than one.

3. The method as claimed in claim 1, wherein said predetermined period of time is a predetermined time period of two to three minutes.

4. The method as claimed in claim 1, wherein said tunnel magnetoresistive effect element is a tunnel magnetoresistive effect head element.

5. The method as claimed in claim 1, wherein said tunnel magnetoresistive effect element is a magnetoresistive effect random access memory element.

6. An apparatus for testing a tunnel magnetoresistive effect element comprising:
    means for measuring initially a resistance value of said tunnel magnetoresistive effect element to provide the measured resistance value as a first resistance value;
    means for measuring a resistance value of said tunnel magnetoresistive effect element after continuously feeding a current through said tunnel magnetoresistive effect element from an anti-substrate side to a substrate side for a predetermined period of time, to provide the measured resistance value as a second resistance value; and
    means for evaluating whether said tunnel magnetoresistive effect element is a non-defective product with no pinhole based upon a ratio of said second resistance value to said first resistance value.

7. The apparatus as claimed in claim 6, wherein said evaluation means comprises means for judging that said tunnel magnetoresistive effect element is a non-defective product when said ratio is smaller than one.

8. The apparatus as claimed in claim 6, wherein said predetermined period of time is a predetermined time period of two to three minutes.

9. The apparatus as claimed in claim 6, wherein said tunnel magnetoresistive effect element is a tunnel magnetoresistive effect head element.

10. The apparatus as claimed in claim 6, wherein said tunnel magnetoresistive effect element is a magnetoresistive effect random access memory element.

* * * * *